United States Patent
Lin et al.

(10) Patent No.: US 9,502,585 B2
(45) Date of Patent: Nov. 22, 2016

(54) SCHOTTKY BARRIER DIODE AND METHOD OF MANUFACTURING THE SAME

(71) Applicant: TAIWAN SEMICONDUCTOR MANUFACTURING CO., LTD., Hsinchu (TW)

(72) Inventors: Meng-Han Lin, Hsinchu (TW); Chien-Chih Chou, New Taipei (TW); Chih-Wen Hsiung, Hsinchu (TW); Kong-Beng Thei, Pao-Shen Village (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/690,209

(22) Filed: Apr. 17, 2015

(65) Prior Publication Data

US 2016/0308071 A1   Oct. 20, 2016

(51) Int. Cl.

| | |
|---|---|
| *H01L 29/872* | (2006.01) |
| *H01L 29/66* | (2006.01) |
| *H01L 21/762* | (2006.01) |
| *H01L 21/02* | (2006.01) |
| *H01L 21/324* | (2006.01) |
| *H01L 29/06* | (2006.01) |
| *H01L 29/47* | (2006.01) |
| *H01L 21/225* | (2006.01) |

(52) U.S. Cl.
CPC ......... *H01L 29/872* (2013.01); *H01L 21/0217* (2013.01); *H01L 21/02164* (2013.01); *H01L 21/2251* (2013.01); *H01L 21/324* (2013.01); *H01L 21/762* (2013.01); *H01L 29/0649* (2013.01); *H01L 29/47* (2013.01); *H01L 29/66143* (2013.01)

(58) Field of Classification Search
None
See application file for complete search history.

(56) References Cited

U.S. PATENT DOCUMENTS

| 4,313,971 | A * | 2/1982 | Wheatley, Jr. .... | H01L 21/28581 148/DIG. 117 |
|---|---|---|---|---|
| 2003/0030120 | A1* | 2/2003 | Fujihira ............. | H01L 29/0692 257/471 |
| 2006/0237813 | A1* | 10/2006 | Hshieh ................. | H01L 29/402 257/475 |
| 2009/0283841 | A1* | 11/2009 | Yeh ..................... | H01L 27/0814 257/384 |
| 2012/0049287 | A1* | 3/2012 | Chen ................ | H01L 29/66136 257/368 |

(Continued)

OTHER PUBLICATIONS

P.A. Stolk, A.C.M.C van Brandenburg, A.H Montree, Oxidation enhanced diffusion during the growth of ultrathin oxides, Materials Science in Semiconductor Processing, vol. 2, Issue 1, Apr. 1999, pp. 29-33.*
Dobkin, D.M., "Boron and Phosphorus Diffusion in SiO2 and SiOxNy" Jan. 9, 2015 downloaded from URL<https://web.archive.org/web/20150109184932/http://www.enigmatic-consulting.com/semiconductor_processing/selected_shorts/B_and_P_diff.html> on May 5, 2016.*
Jones, S. W. "Diffusion in Silicon" IC Knowledge LLC, 2000.*

(Continued)

*Primary Examiner* — Joseph Schoenholtz
(74) *Attorney, Agent, or Firm* — Maschoff Brennan

(57) ABSTRACT

A method of manufacturing a Schottky barrier diode is provided, which includes: providing a semiconductor substrate including a first well region of a first conductivity type in the semiconductor substrate; forming a surface-doped layer having a dopant of a second conductivity type opposite to the first conductivity type in the first well region; forming a dielectric layer in contact with the surface-doped layer; performing a thermal treatment on the surface-doped layer to move the dopant of the surface-doped layer in the dielectric layer; removing the dielectric layer to expose the first well region; and forming a silicide layer in contact with the exposed first well region. A Schottky barrier diode is also provided.

18 Claims, 7 Drawing Sheets

(56) References Cited

U.S. PATENT DOCUMENTS

2012/0086099 A1* 4/2012 Yeh .................... H01L 29/0619
                                                    257/475

2014/0061848 A1* 3/2014 Chang ................. H01L 27/0921
                                                    257/476

* cited by examiner

SCHOTTKY BARRIER DIODE AND METHOD OF MANUFACTURING THE SAME

BACKGROUND

Schottky barrier diode has superior characteristics of low turn-on voltage, low power loss, fast recovery time and low junction capacitance compared to a PN junction diode, and thus has been widely used in power and high voltage (HV) technology. Typically, the Schottky barrier diode includes a metal layer and a doped semiconductor layer, and the Schottky barrier is formed at the juncture of the metal layer and the semiconductor layer. Breakdown voltage is improved by placing a guard ring in a semiconductor substrate around the Schottky barrier. Nevertheless, an existing Schottky barrier diode exhibits low forward current. Therefore, how to improve the forward current of the existing Schottky barrier diode becomes an important issue in this field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
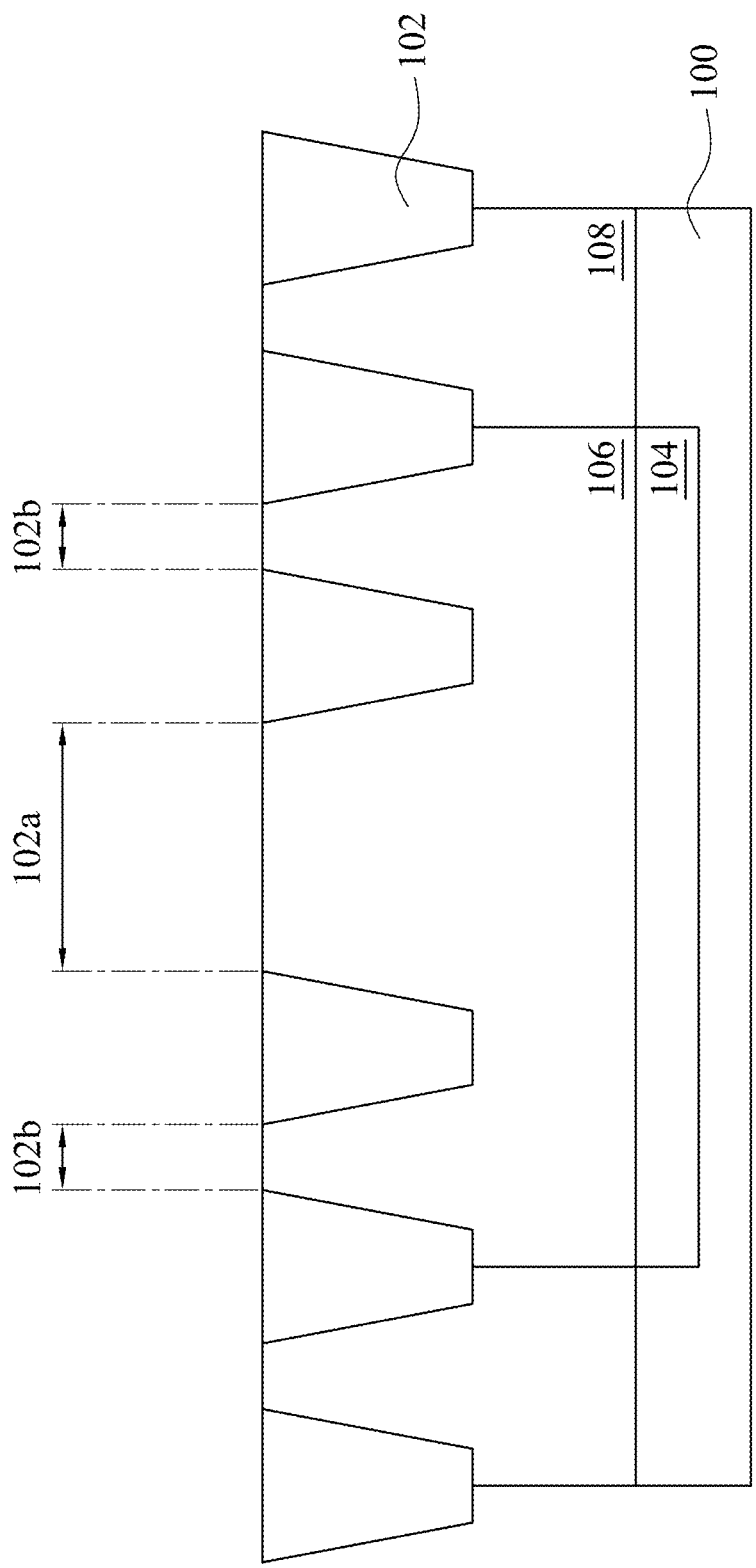
FIGS. 1A-1F are cross-sectional views at various stages of manufacturing a Schottky barrier diode in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As mentioned above, the existing Schottky barrier diode exhibits low forward current. For instance, the process of forming the Schottky barrier diode may be combined with other processes, such as the process of forming NMOS transistor and/or PMOS transistor. One or more layers for specific applications unrelated to the Schottky barrier diode may be added to the Schottky barrier diode. However, the added layer(s) may deteriorate the forward current of the Schottky barrier diode. For a specific example, a surface-doped semiconductor layer is formed in a channel region of a NMOS transistor or PMOS transistor to tune threshold voltage (Vt) thereof. The surface-doped semiconductor layer also formed in the Schottky barrier diode, such as formed between a doped well region and a metal layer of the Schottky barrier diode, may result in low forward current of the Schottky barrier diode. The surface-doped semiconductor layer may not be formed in the Schottky barrier diode, such as between the doped well region and the metal layer, by using an extra mask, but the extra mask is too costly.

In view of the foregoing, the present disclosure provides a method of manufacturing a Schottky barrier diode without a surface-doped semiconductor layer to solve the issue of low forward current mentioned above. In this method, the surface-doped semiconductor layer is formed without using any extra mask, and then completely moved in a specific material using one or more thermal treatments. The thermal treatment may be extra added or included in follow-up processing steps for forming other elements. The thermal treatment included in the follow-up processing steps does not generate extra costs and is fully compatible to the process of manufacturing the existing Schottky barrier diode having the surface-doped semiconductor layer and the NMOS and/or PMOS transistor. In addition, it is noteworthy that, the Schottky barrier diode manufactured using the method of the present disclosure not only exhibits much higher forward current but also does not affect reverse characteristics compared to the existing Schottky barrier diode having the surface-doped semiconductor layer. Embodiments of the method of manufacturing the Schottky barrier diode without the surface-doped semiconductor layer and the Schottky barrier diode will be sequentially described below in detail.

FIGS. 1A-1F are cross-sectional views at various stages of manufacturing a Schottky barrier diode in accordance with some embodiments of the present disclosure. Referring to FIG. 1A, a semiconductor substrate 100 is provided. In some embodiments, the semiconductor substrate 100 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the semiconductor substrate 100 is a p-type semiconductor substrate.

The semiconductor substrate 100 includes a first well region 106 of a first conductivity type in the semiconductor substrate 100. In some embodiments, the first well region 106 is an n-well (NW). In some embodiments, the dopant concentration of the first well region 106 is ranging from about $10^{11}$ ions/cm$^3$ to about $10^{14}$ ions/cm$^3$, although a higher dopant concentration is also applicable. In some embodiments, the first well region 106 is formed by implanting n-type impurities into the semiconductor substrate 100, such as phosphorus, arsenic, antimony, bismuth, selenium, or tellurium, or another suitable n-type dopant. Alternatively, in some embodiments, the first well region 106 is formed by epitaxially growing a semiconductor layer on the semiconductor substrate 100, and then performing an n-type impurity implantation.

In some embodiments, the semiconductor substrate 100 further includes a deep well region 104 of the first conductivity type beneath the first well region 106. In some embodiments, the deep well region 104 is a deep n-type well (DNW) region. The deep well region 104 may be omitted in some embodiments. In some embodiments, the deep well region 104 is formed by implanting n-type impurities into the semiconductor substrate 100, such as phosphorus, arsenic, antimony, bismuth, selenium, or tellurium, or another suitable n-type dopant. Alternatively, in some embodiments, the deep well region 104 is formed by epitaxially growing a semiconductor layer on the semiconductor substrate 100, and then performing an n-type impurity implantation.

In some embodiments, the semiconductor substrate 100 further includes a third well region 108 of a second conductivity type opposite to the first conductivity type in the semiconductor substrate 100. In some embodiments, the third well region 108 is a p-well (PW). In some embodiments, the dopant concentration of the third well region 108 is ranging from about $10^{11}$ ions/cm$^3$ to about $10^{14}$ ions/cm$^3$, although a higher dopant concentration is also applicable. In some embodiments, the third well region 108 is formed by implanting p-type impurities into the semiconductor substrate 100, such as boron, boron difluoride or another suitable p-type dopant. Alternatively, in some embodiments, the third well region 108 is formed by epitaxially growing a semiconductor layer on the semiconductor substrate 100, and then performing a p-type impurity implantation.

In some embodiments, the semiconductor substrate 100 further includes an isolation region 102 in the first well region 106. In some embodiments, the semiconductor substrate 100 further includes a plurality of isolation regions 102 in the first well region 106, the third well region 108 or between the first well region 106 and the third well region 108. In some embodiments, the isolation portion 102 is a shallow trench isolation (STI). In some embodiments, the isolation portion 102 includes silicon oxide, silicon nitride, silicon oxynitride, a low-k dielectric material, and/or a combination thereof. In some embodiments, the isolation portion 102 includes silicon oxide. In some embodiments, the isolation region 102 is formed by selective oxidation. In some embodiments, the isolation region 102 is firstly formed, and the deep well region 104, the first well region 106 and the third well region 108 are then sequentially formed. The formation order of the isolation region 102, the deep well region 104, the first well region 106 and the third well region 108 may be appropriately changed and not limited to the embodiments mentioned above.

The formed isolation region 102 is configured to define a diode area 102a of the first well region 106 and a contact area 102b of the first well region 106 separated from each other by the isolation region 102. As shown in FIG. 1A, the diode area 102a is between two contact area 102b; however, in some embodiments, in top view, the diode area 102a is surrounded by a contact area 102b. In some embodiments, the exposed area (not marked) of the third well region 108 is another contact area.

Figure 1B:
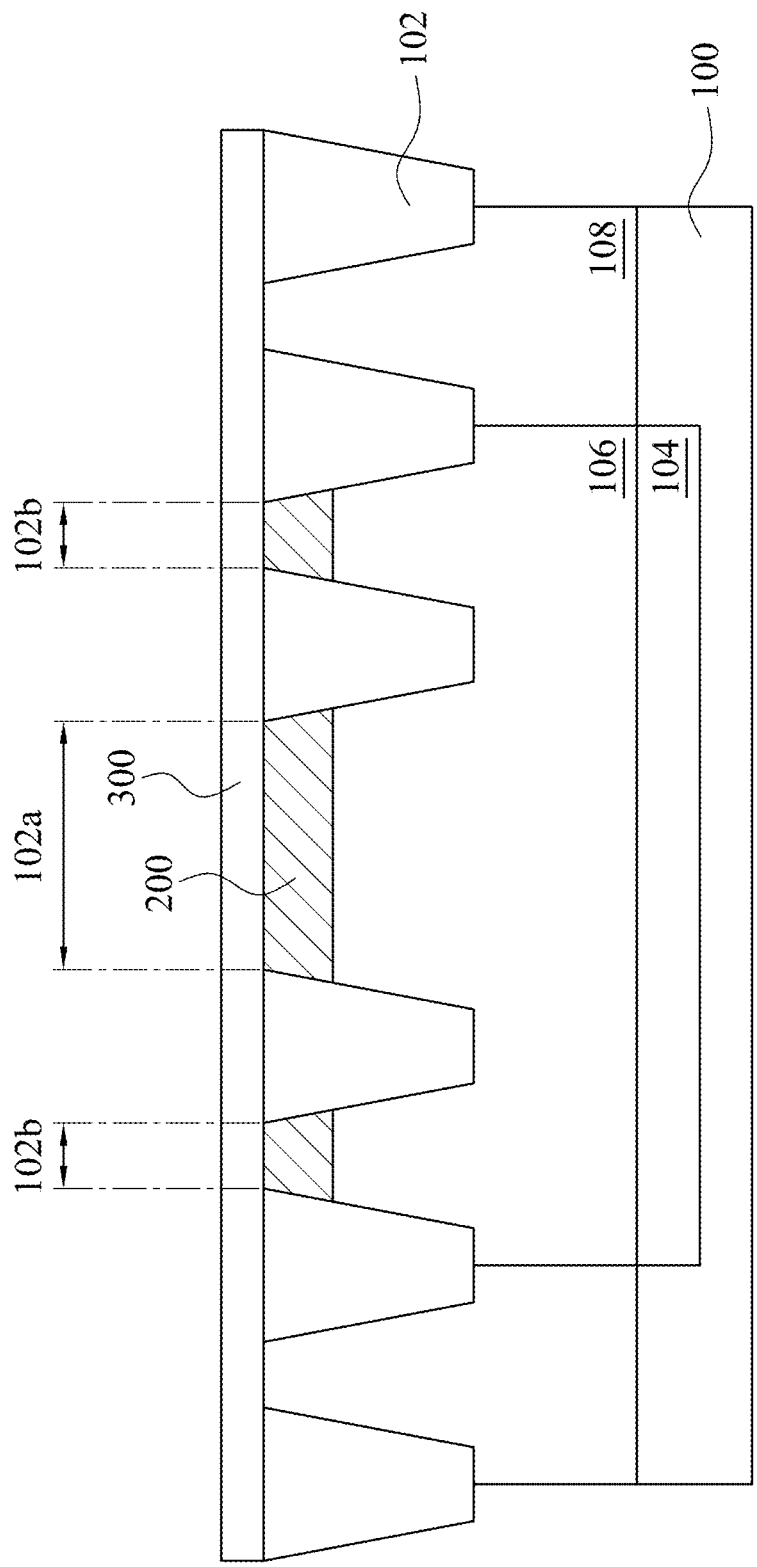

Referring to FIG. 1B, a surface-doped layer 200 having a dopant of the second conductivity type is formed in the first well region 106. Specifically, the surface-doped layer 200 is formed in the diode area 102a of the first well region 106. In some embodiments, the surface-doped layer 200 is further formed in the contact area 102b of the first well region 106. In some embodiments, the surface-doped layer 200 includes a p-type dopant, such as boron, boron difluoride or another suitable p-type dopant.

It is noteworthy that in some embodiments, the surface-doped layer 200 is used to form in a channel region (not shown) of the NMOS transistor or PMOS transistor, and thus to tune threshold voltage (Vt) thereof. In some embodiments, the surface-doped layer 200 having the p-type dopant is used to form in a n-channel region of the PMOS transistor, and thus to tune threshold voltage (Vt) thereof. In some embodiments, the surface-doped layer 200 is formed in both the first well region 106 and the channel region. In some embodiments, the surface-doped layer 200 is formed into the first n-well region 106 and the n-channel region of the PMOS transistor by implanting p-type impurities without using any mask.

Figure 1C:
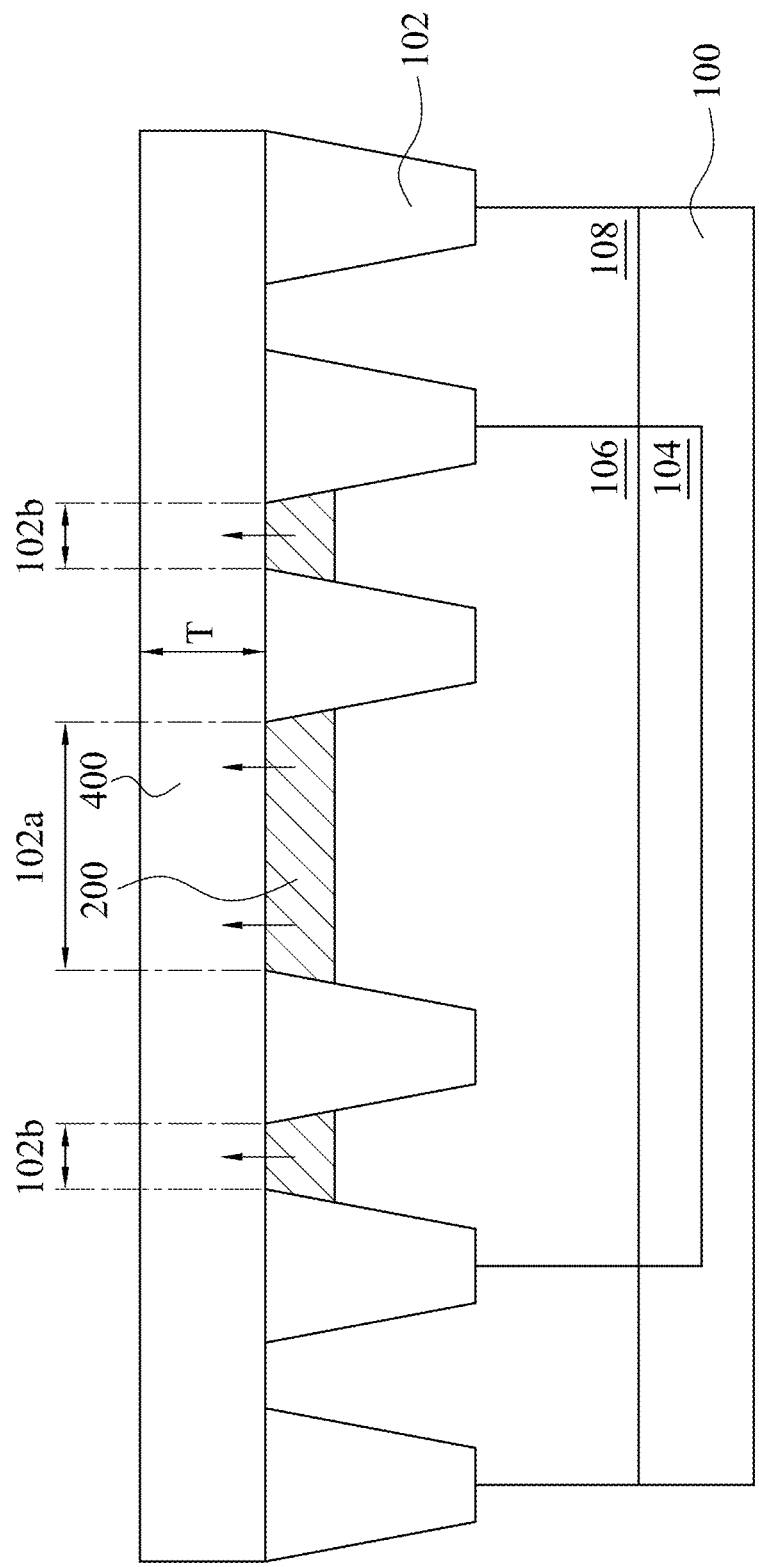

However, the surface-doped layer 200 formed in the first well region 106 will deteriorate forward current of the Schottky barrier diode. Accordingly, as shown in FIG. 1C, a dielectric layer 400 is formed in contact with the surface-doped layer 200 to receive or absorb the dopant of the surface-doped layer 200. In some embodiments, the dielectric layer 400 is formed over the first well region 106. In some embodiments, the dielectric layer 400 is formed over the entire first well region 106 and the second well region 108. In some embodiments, the dielectric layer 400 is formed using a physical vapor deposition (PVD) process, a chemical vapor deposition (CVD) process (e.g., plasma enhanced CVD (PECVD), low pressure CVD (LPCVD) or atmosphere pressure CVD (APCVD)), a spin-on coating process, a thermal grown (e.g., a thermal dry oxidation or a thermal wet oxidation) or another formation process. In some embodiments, the dielectric layer 400 is formed using thermal oxidation. In some embodiments, the dielectric layer 400 includes silicon oxide. In some embodiments, the dielectric layer 400 excludes silicon nitride since the dopant of the surface-doped layer 200 cannot be driven into a silicon nitride layer. In some embodiments, a portion (not shown) of the dielectric layer 400 is acted as a gate dielectric layer of the NMOS transistor and/or PMOS transistor. In some embodiments, the dielectric layer 400 has a thickness T in a range of 200 Å to 3000 Å, although a greater or smaller thicknesses are also applicable.

In some embodiments, referring to FIGS. 1B and 1C, a silicon nitride-containing layer 300 is formed over the surface-doped layer 200 after forming the surface-doped layer 200 and before forming the dielectric layer 400. In some embodiments, the silicon nitride-containing layer 300 is acted as an etch stop layer and will then be removed in follow-up processing steps. In some embodiments, the silicon nitride-containing layer 300 is made of silicon nitride. However, based on the above, the dopant of the surface-doped layer 200 fails to be driven into a silicon nitride-containing layer; therefore, the silicon nitride-containing layer 300 should be removed before forming the dielectric layer 400 to avoid blocking of the dopant of the surface-doped layer 200 when the dopant of the surface-doped layer 200 is driven.

Continuously referring to FIG. 1C, after the dielectric layer 400 is formed, a thermal treatment is performed on the surface-doped layer 200 to move the dopant of the surface-doped layer 200 in the dielectric layer 400. In some embodiments, when the dielectric layer 400 is formed using thermal oxidation, a thermal treatment is accompanied with the thermal oxidation and can help drive the dopant of the surface-doped layer 200 into the dielectric layer 400 without generating extra manufacturing costs. In other words, performing the thermal treatment on the surface-doped layer 200 to move the dopant of the surface-doped layer 200 in the dielectric layer 400 is included in forming the dielectric layer 400. Alternatively, the thermal treatment is extra added in some embodiments. In some embodiments, the extra added thermal treatment or the thermal treatment included in forming the dielectric layer 400 is greater than or equal to 400° C. In some embodiments, the extra added thermal treatment or the thermal treatment included in forming the dielectric layer 400 is lower than or equal to 1200° C., although a higher temperature is also applicable.

Figure 1D:
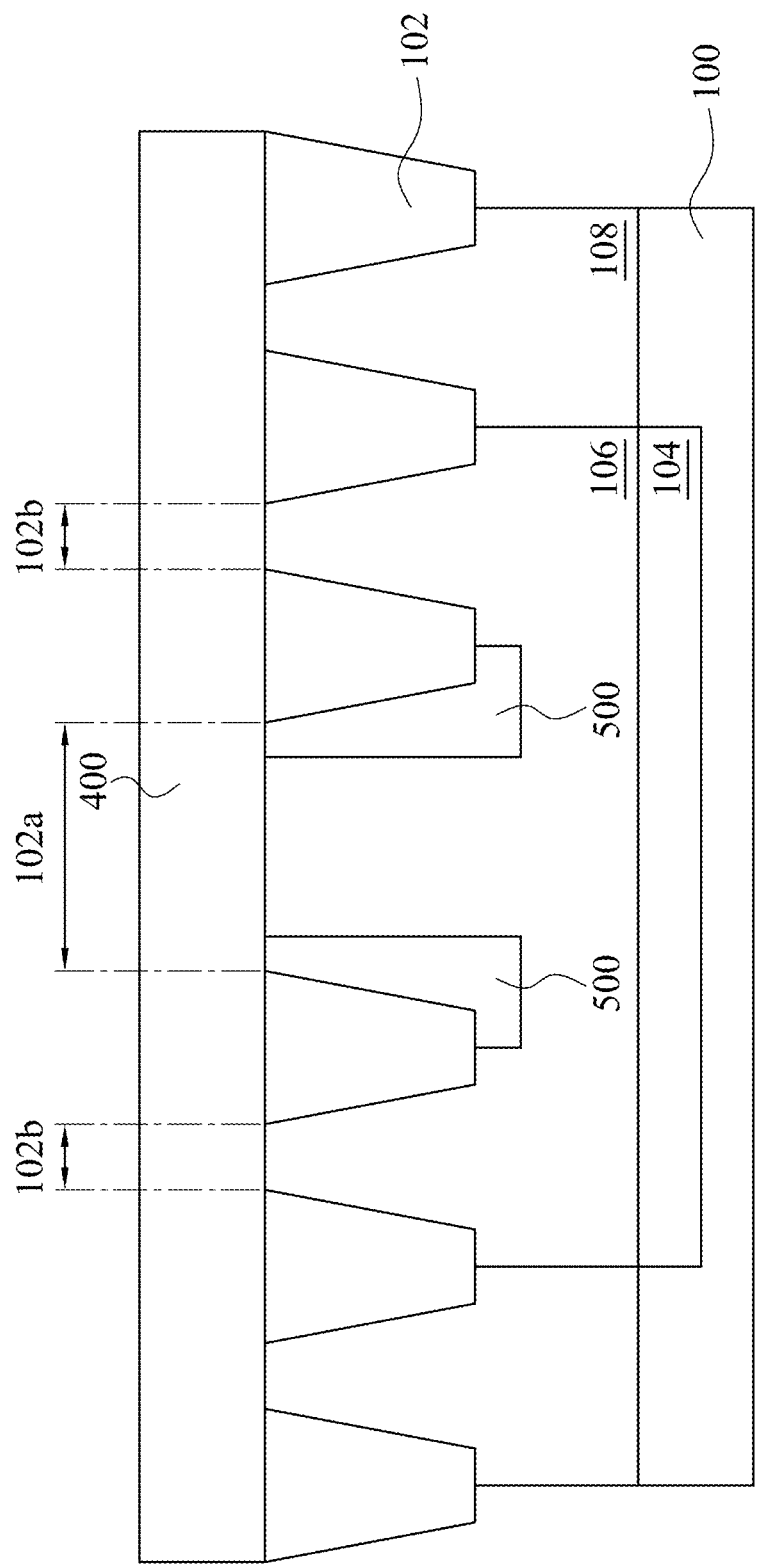

Referring to FIG. 1D, the method further includes forming a second well region 500 of the second conductivity type in the first well region 106 after forming the dielectric layer 400. In some embodiments, in top view, the second well region 500 is ring-shaped and surrounds the diode area 102a of the first well region 106. The second well region 500 is configured to surround a silicide layer (not shown in FIG. 1D but shown in FIG. 1F) formed over the diode area 102a of the first well region 106 in follow-up processing steps to improve breakdown voltage. In some embodiments, the dopant concentration of the second well region 500 is ranging from about $10^{11}$ ions/cm$^3$ to about $10^{14}$ ions/cm$^3$, although a higher dopant concentration is also applicable.

In some embodiments, the second well region 500 is formed by implanting a dopant of the second conductivity type into a specific region of the first well region 106 and performing an annealing process, such as a rapid thermal annealing process (RTA). The annealing process can also help drive the dopant of the surface-doped layer 200 of FIG. 1C into the dielectric layer 400. In other words, performing the thermal treatment on the surface-doped layer 200 to move the dopant of the surface-doped layer 200 in the dielectric layer 400 is included in forming the second well region 500. The annealing process included in forming the second well region 500 can help effectively remove the surface-doped layer 200 in the first n-well region 106 without generating extra manufacturing costs. In some embodiments, the thermal treatment (i.e., the annealing process) included in forming the second well region 500 is greater than or equal to 400° C. In some embodiments, the thermal treatment included in forming the second well region 500 is lower than or equal to 1200° C., although higher temperature is also applicable.

Figure 1E:
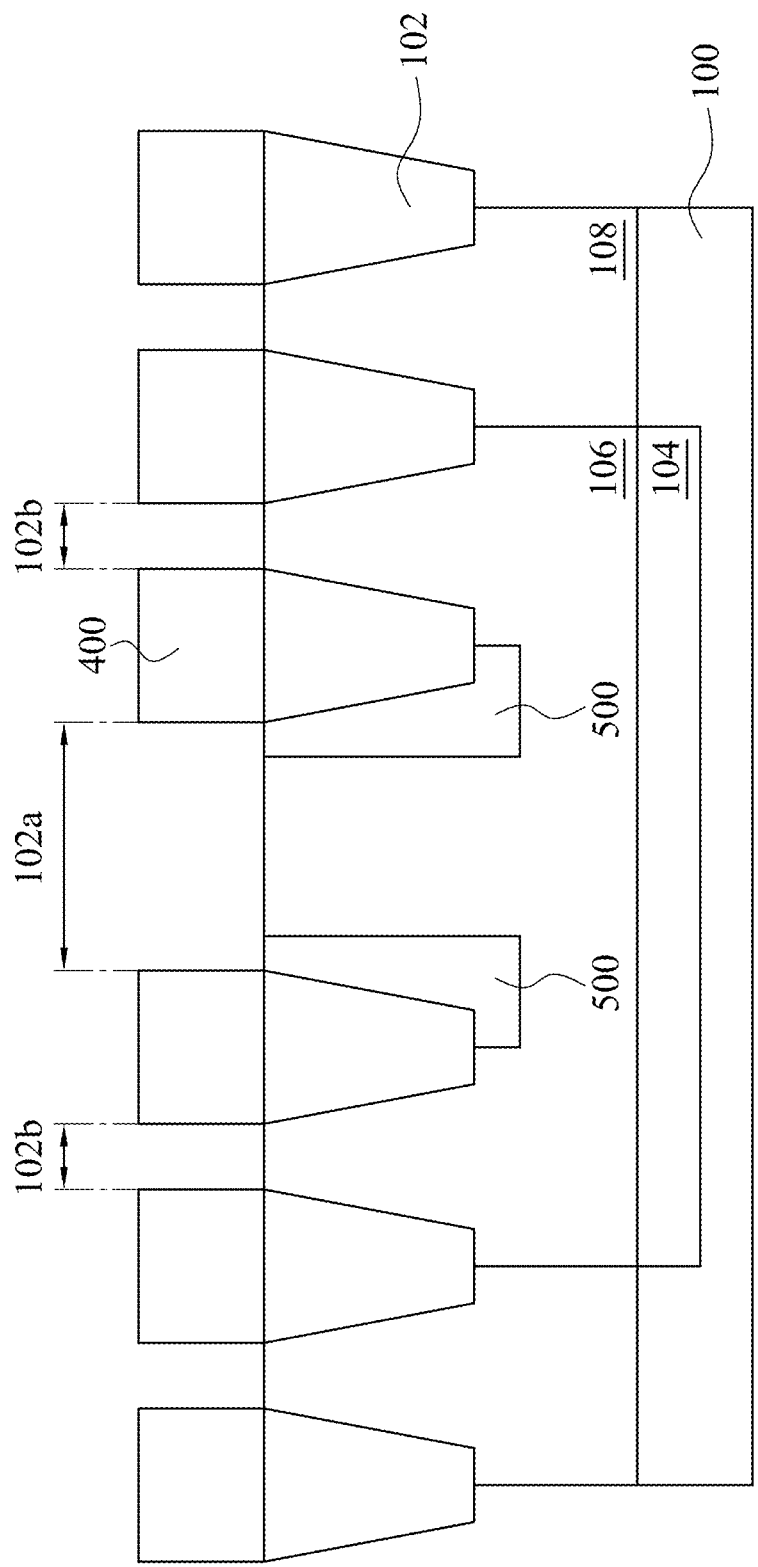

Referring to FIGS. 1D and 1E, the dielectric layer 400 over the diode area 102a is removed to expose the diode area 102a of the first well region 106. Specifically, the dielectric layer 400 is patterned to expose the diode area 102a of the first well region 106. In some embodiments, the dielectric layer 400 is patterned to further expose the contact area 102b of the first well region 106. In some embodiments, the dielectric layer 400 is patterned to further expose the contact area (not marked) of the third well region 108. In some embodiments, the dielectric layer 400 is patterned using a photolithography/etching process, a laser drilling process or another suitable material removal process.

It is noted that, if the second well region 500 is formed after the dielectric layer 400 is removed or patterned, some residual dopant of the surface-doped layer 200 in the first well region 106 cannot be completely removed in some embodiments. Therefore, in some embodiments, to completely remove the dopant of the surface-doped layer 200 in the first well region 106, forming the second well region 500 is before removing or patterning the dielectric layer 400. In addition, before the dielectric layer 400 is removed or patterned, other processing steps for forming other elements including thermal treatments can also help drive the residual dopant of the surface-doped layer 200 into the dielectric layer 400.

Figure 1F:
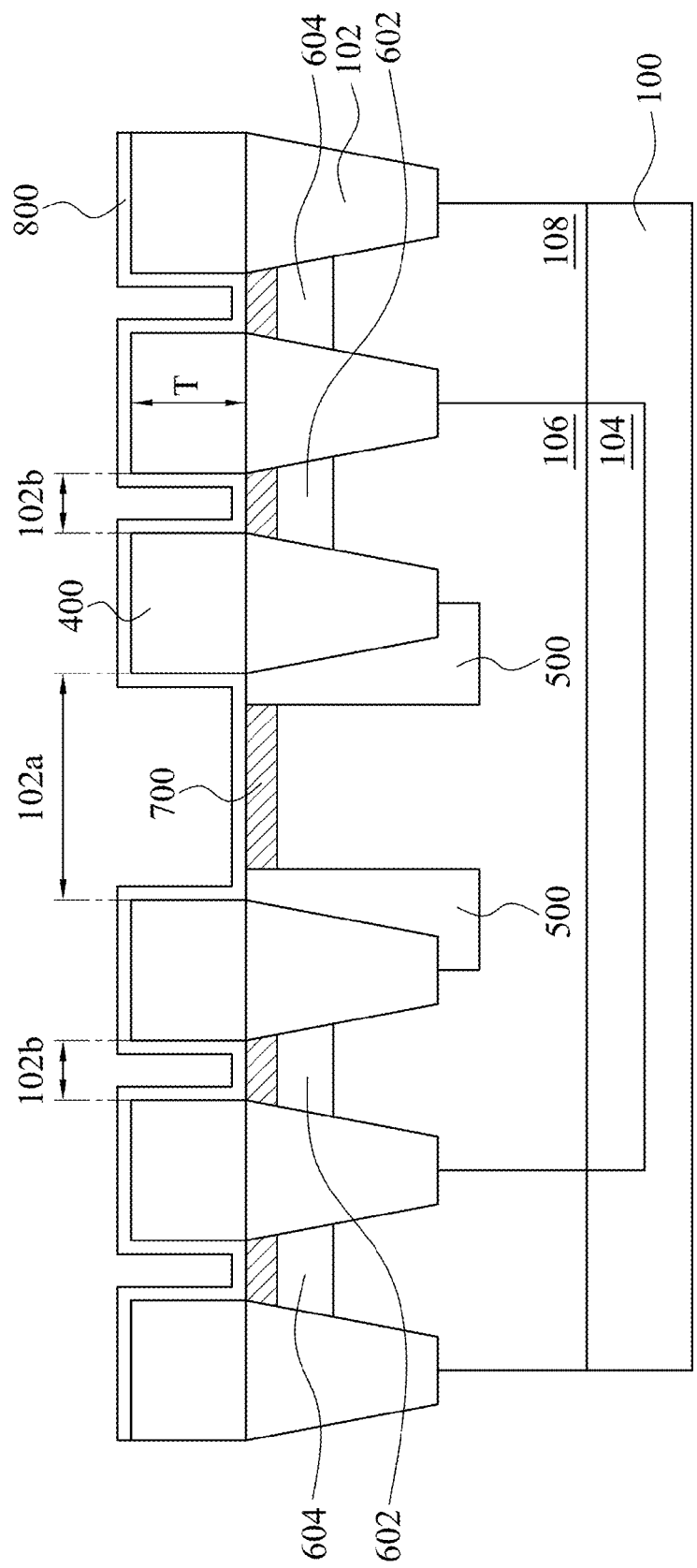

Referring to FIGS. 1E and 1F, a silicide layer 700 is formed in contact with the exposed first well region 106 of FIG. 1E. Specifically, the silicide layer 700 is formed in contact with the exposed diode area 102a of the first well region 106. In some embodiments, the silicide layer 700 is formed in contact with the diode area 102a, the contact area 102b and the contact area (not marked) of the third well region 108. In some embodiments, the silicide layer 700 is formed by forming a metal-containing layer (not shown) and then performing an annealing process on the metal-containing layer. In some embodiments, the metal-containing layer includes cobalt, titanium, tungsten, nickel or a combination thereof. In some embodiments, the silicide layer 700 includes a material selected from the group consisting of cobalt silicide, titanium silicide, tungsten silicide, nickel silicide and a combination thereof.

In some embodiments, the method further includes forming a heavily doped layer 602 of the first conductivity type in the contact area 102b of the first well region 106. In some embodiments, forming the heavily doped layer 602 is before forming the silicide layer 700. In some embodiments, a portion (not shown) of the heavily doped layer 602 is acted as a source region or a drain region of the NMOS transistor and/or PMOS transistor. In some embodiments, two portions (not shown) of the heavily n-doped layer 602 are respectively acted as source and drain regions of the NMOS transistor.

In some embodiments, the method further includes forming another heavily doped layer 604 of the second conductivity type in the contact area (not marked) of the third well region 108. In some embodiments, forming the heavily doped layer 604 is before forming the silicide layer 700. In some embodiments, a portion (not shown) of the heavily doped layer 604 (not shown) is acted as a source region or a drain region of the NMOS transistor and/or PMOS transistor. In some embodiments, two portions (not shown) of the heavily p-doped layer 604 are respectively acted as source and drain regions of the PMOS transistor.

In some embodiments, patterning the dielectric layer 400 further includes to remain the dielectric layer 400 over the isolation region 102. In some embodiments, the dielectric layer 400 and the isolation layer 102 include silicon oxide. In some embodiments, the dielectric layer 400 and the isolation layer 102 exclude silicon nitride.

In some embodiments, the method further includes forming a contact etch stop layer (CESL) 800 over the dielectric layer 400 and the silicide layer 700. In some embodiments, the contact etch stop layer 800 is formed of silicon nitride, silicon oxynitride, silicon carbon nitride, any other suitable insulating material or a combination thereof. In some embodiments, the contact etch stop layer 800 is formed using a PVD process, a CVD process, a spin-on coating process, a thermal grown or another formation process.

In some embodiments, the method further includes forming an inter-layer dielectric (ILD) (not shown) over the contact etch stop layer 800. In some embodiments, the inter-layer dielectric includes silicon oxide, silicon nitride, silicon oxynitride, any other suitable insulating material or a combination thereof. In some embodiments, the ILD is formed using a PVD process, a CVD process, a spin-on coating process, a thermal grown or another formation process.

The present disclosure further provides a Schottky barrier diode, which includes a semiconductor substrate 100, a first well region 106, an isolation region 102, a silicide layer 700 and a silicon oxide-containing layer 400, as shown in FIG. 1F.

The semiconductor substrate 100 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the semiconductor substrate 100 is a p-type semiconductor substrate.

The first well region 106 of a first conductivity type is in the semiconductor substrate 100. In some embodiments, the first well region 106 is an n-well (NW). In some embodiments, the dopant concentration of the first well region 106 is ranging from about $10^{11}$ ions/cm$^3$ to about $10^{14}$ ions/cm$^3$.

The isolation region 102 is in the first well region 106 to define a diode area 102a of the first well region 106 and a contact area 102b of the first well region 106 separated from each other by the isolation region 102. In some embodiments, the isolation portion 102 is a shallow trench isolation (STI). In some embodiments, the isolation portion 102 includes silicon oxide, silicon nitride, silicon oxynitride, a low-k dielectric material, and/or a combination thereof.

In some embodiments, the Schottky barrier diode further includes a deep well region 104 of the first conductivity type beneath the first well region 106. In some embodiments, the deep well region 104 is a deep n-type well (DNW) region. The deep well region 104 may be omitted in some embodiments.

In some embodiments, the Schottky barrier diode further includes a third well region 108 of a second conductivity type opposite to the first conductivity type in the semiconductor substrate 100. In some embodiments, the third well region 108 is a p-well (PW). In some embodiments, the dopant concentration of the third well region 108 is ranging from about $10^{11}$ ions/cm$^3$ to about $10^{14}$ ions/cm$^3$.

The silicide layer 700 is laterally adjacent to the isolation region 102, and over and in contact with the first well region 106. In some embodiments, the silicide layer 700 includes cobalt silicide, titanium silicide, tungsten silicide, nickel silicide and a combination thereof. In some embodiments, the silicide layer 700 is not in contact with the isolation region 102. In some embodiments, the silicide layer 700 is not in contact with the silicon-containing layer 400.

The silicon oxide-containing layer 400 is over and in contact with the isolation region 102. In some embodiments, the silicon oxide-containing layer 400 is substantially aligned with the isolation layer 102. The term "substantially aligned" refers to aligned with some acceptable deviation and does not require exact alignment. In some embodiments, an edge of the silicon oxide-containing layer 400 is aligned with an edge of the isolation 102, as shown in FIG. 1F. In some embodiments, an edge of the silicon oxide-containing layer touches an upper surface of a second well region. In some embodiments, an edge of the silicon oxide-containing layer touches an upper surface of the isolation region 102. In some embodiments, the silicon oxide-containing layer 400 has a thickness T in a range of 200 Å to 3000 Å. In some embodiments, the silicon oxide-containing layer 400 excludes silicon nitride.

In some embodiments, the Schottky barrier diode further includes a second well region 500 of the second conductivity type surrounding the silicide layer 700 to improve breakdown voltage of the Schottky barrier diode. In some embodiments, the second well region 500 is between the silicide layer 700 and the isolation region 102.

In some embodiments, the Schottky barrier diode further includes a heavily doped layer 602 of the first conductivity type in the contact area 102b of the first well region 106. In some embodiments, the Schottky barrier diode further includes a heavily doped layer 604 of the second conductivity type in a contact area (not marked) of the third well region 108.

In some embodiments, the Schottky barrier diode further includes a contact etch stop layer 800 over the silicon oxide-containing layer 400 and the silicide layer 700. In some embodiments, the contact etch stop layer 800 is formed of silicon nitride, silicon oxynitride, silicon carbon nitride, any other suitable insulating material or a combination thereof.

In some embodiments, the Schottky barrier diode further includes an inter-layer dielectric (not shown) over the contact etch stop layer 800. In some embodiments, the inter-layer dielectric includes silicon oxide, silicon nitride, silicon oxynitride, any other suitable insulating material or a combination thereof.

Figure 2:
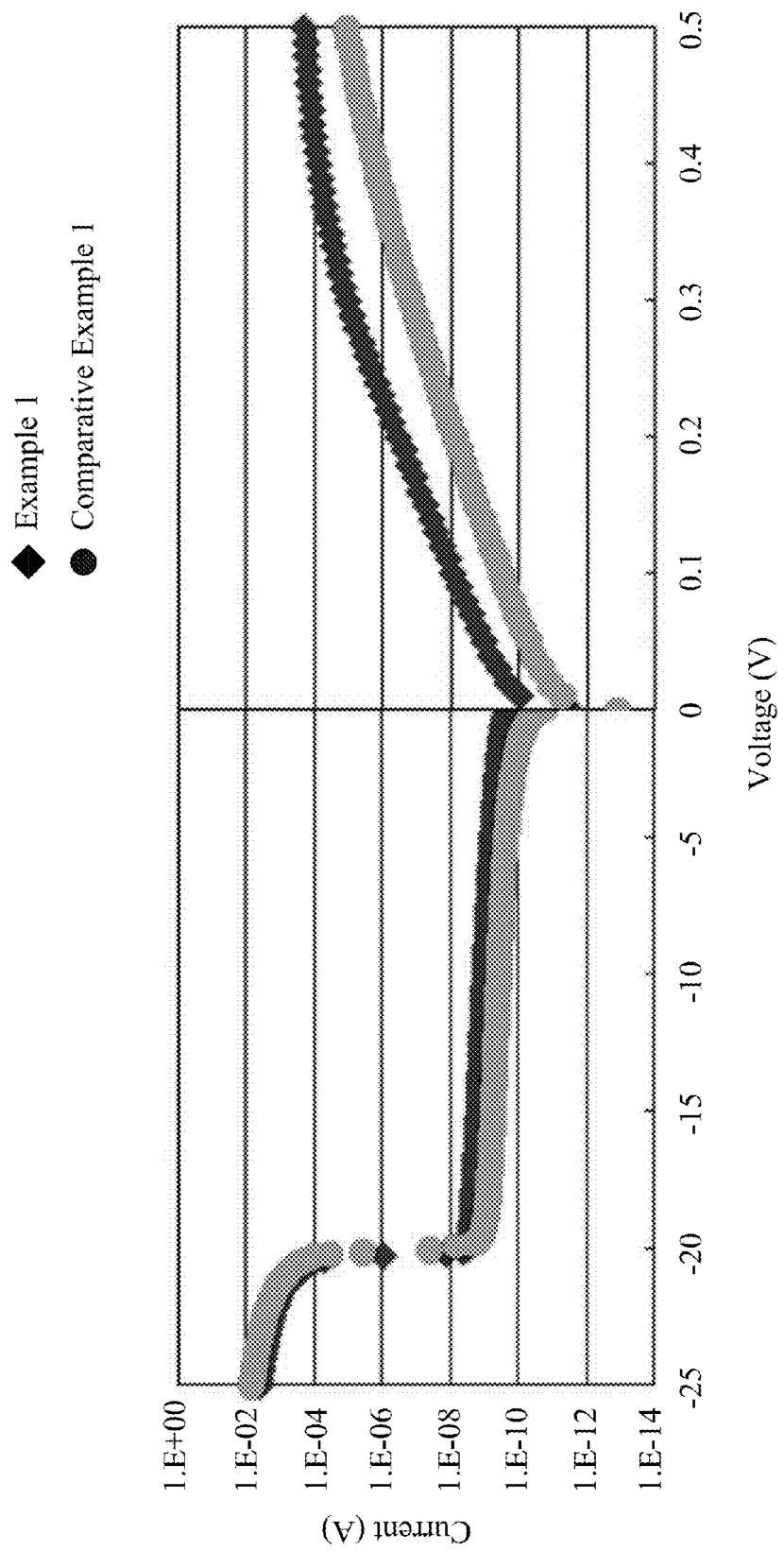
FIG. 2 is a current-voltage diagram of a Schottky barrier diode with a surface-doped modulation (redistribution) process (i.e., Example 1) and a Schottky barrier diode without a surface-doped modulation (redistribution) process (i.e., Comparative Example 1).

FIG. 2 is a current-voltage diagram of a Schottky barrier diode with a surface-doped modulation (redistribution) process (i.e., Example 1) and a Schottky barrier diode without a surface-doped modulation (redistribution) process (i.e., Comparative Example 1). The Schottky barrier diode of Example 1 has a structure of FIG. 1F, and the Schottky barrier diode of Comparative Example 1 has a structure of FIG. 1F and an additional surface-doped layer (not shown in FIG. 1F) beneath and in contact with the silicide layer 700. In the Schottky barrier diodes of Example 1 and Comparative Example 1, the heavily doped layer 602 is acted as a cathode, and the silicide layer 700 is acted as an anode. As shown in FIG. 2, the forward current of Example 1 is significantly higher than that of Comparative Example 1, and the reverse current of Example 1 is similar to that of Comparative Example 1. Therefore, the Schottky barrier diode of the present disclosure can indeed effectively solve the issue of low forward current and does not affect reverse characteristics.

According to some embodiments, a Schottky barrier diode includes a semiconductor substrate, a first well region, an isolation region, a silicide layer and a silicon oxide-containing layer. The first well region of a first conductivity type is in the semiconductor substrate. The isolation region is in the first well region. The silicide layer is laterally adjacent to the isolation region, and over and in contact with the first well region. The silicon oxide-containing layer is over and in contact with the isolation region.

According to some embodiments, a method of manufacturing a Schottky barrier diode is provided, which includes: providing a semiconductor substrate including a first well region of a first conductivity type in the semiconductor substrate; forming a surface-doped layer having a dopant of a second conductivity type opposite to the first conductivity type in the first well region; forming a dielectric layer in contact with the surface-doped layer; performing a thermal treatment on the surface-doped layer to move the dopant of the surface-doped layer in the dielectric layer; removing the dielectric layer to expose the first well region; and forming a silicide layer in contact with the exposed first well region.

According to some embodiments, a method of manufacturing a Schottky barrier diode is provided, which includes: providing a semiconductor substrate including a first well region of a first conductivity type in the semiconductor substrate and an isolation region in the first well region to define a diode area of the first well region and a contact area of the first well region separated from each other by the isolation region; forming a surface-doped layer having a dopant of a second conductivity type opposite to the first conductivity type in the diode area of the first well region; forming a dielectric layer over the first well region and in contact with the surface-doped layer; performing a thermal treatment on the surface-doped layer to move the dopant of the surface-doped layer in the dielectric layer; patterning the dielectric layer to expose the diode area of the first well region; and forming a silicide layer in contact with the exposed diode area of the first well region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a Schottky barrier diode, the method comprising:
   providing a semiconductor substrate comprising a first well region of a first conductivity type in the semiconductor substrate;
   forming a surface-doped layer having a dopant of a second conductivity type opposite to the first conductivity type in the first well region;
   forming a dielectric layer in contact with the surface-doped layer after forming the surface-doped layer;
   performing a thermal treatment on the surface-doped layer to remove the dopant from the surface-doped layer and to move the dopant into the dielectric layer;
   removing the dielectric layer having the dopant to expose the first well region; and
   forming a silicide layer in contact with the exposed first well region;
   forming a silicon nitride-containing layer over the surface-doped layer after forming the surface-doped layer and before forming the dielectric layer; and
   removing the silicon nitride-containing layer.

2. The method of claim 1, wherein performing the thermal treatment on the surface-doped layer is comprised in forming the dielectric layer.

3. The method of claim 1, further comprising forming a second well region of the second conductivity type in the first well region after forming the dielectric layer, and the second well region is configured to surround the silicide layer.

4. The method of claim 3, wherein forming the second well region of the second conductivity type is before removing the dielectric layer.

5. The method of claim 3, wherein performing the thermal treatment on the surface-doped layer is comprised in forming the second well region.

6. The method of claim 1, wherein the dielectric layer excludes silicon nitride.

7. The method of claim 1, wherein the dielectric layer includes silicon oxide.

8. The method of claim 1, wherein the thermal treatment is greater than or equal to 400° C.

9. A method of manufacturing a Schottky barrier diode, the method comprising:
   providing a semiconductor substrate comprising a first well region of a first conductivity type in the semiconductor substrate and an isolation region in the first well region to define a diode area of the first well region and a contact area of the first well region separated from each other by the isolation region;
   forming a surface-doped layer having a dopant of a second conductivity type opposite to the first conductivity type in the diode area of the first well region;
   forming a dielectric layer over the first well region and in contact with the surface-doped layer after forming the surface-doped layer;
   performing a thermal treatment on the surface-doped layer to remove the dopant from the surface-doped layer and to move the dopant into the dielectric layer;
   patterning the dielectric layer having the dopant to expose the diode area of the first well region, wherein patterning the dielectric layer further comprises maintaining the dielectric layer remaining over the isolation region; and
   forming a silicide layer in contact with the exposed diode area of the first well region.

10. The method of claim 9, wherein patterning the dielectric layer further comprises exposing the contact area of the first well region, and the method further comprises forming a heavily doped layer of the first conductivity type in the contact area of the first well region.

11. The method of claim 9, further comprising forming a second well region of the second conductivity type in the diode area of the first well region after forming the dielectric layer, and the second well region is configured to surround the silicide layer.

12. The method of claim 1, wherein the thermal treatment is lower than or equal to 1200° C.

13. The method of claim 1, wherein the semiconductor substrate further comprises a deep well region of the first conductivity type beneath the first well region.

14. The method of claim 1, wherein forming the dielectric layer in contact with the surface-doped layer and performing the thermal treatment on the surface-doped layer are conducted by a thermal oxidation process.

15. The method of claim 3, wherein performing the thermal treatment on the surface-doped layer and forming the second well region of the second conductivity type in the first well region are conducted by implanting a dopant of the second conductivity type in the first well region and performing an annealing process.

16. The method of claim 9, wherein forming the dielectric layer over the first well region and in contact with the surface-doped layer and performing the thermal treatment on the surface-doped layer are conducted by a thermal oxidation process.

17. The method of claim 11, wherein performing the thermal treatment on the surface-doped layer and forming the second well region of the second conductivity type in the diode area of the first well region are conducted by implanting a dopant of the second conductivity type into the diode area of the first well region and performing an annealing process.

18. The method of claim 9, wherein forming the surface-doped layer having the dopant of the second conductivity type opposite to the first conductivity type in the diode area of the first well region further comprises forming the surface-doped layer having the dopant of the second conductivity type opposite to the first conductivity type in the contact area of the first well region.

* * * * *